(12) United States Patent
Sugama et al.

(10) Patent No.: US 7,408,475 B2
(45) Date of Patent: Aug. 5, 2008

(54) POWER SUPPLY MONITORING DEVICE

(75) Inventors: Koichi Sugama, Kawasaki (JP); Noboru Shimizu, Kawasaki (JP); Tsutomu Chikazawa, Kawasaki (JP); Ryuji Kayama, Kawasaki (JP); Kenichi Yajima, Kawasaki (JP); Yukio Katayanagi, Kawasaki (JP); Takashi Kaiga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 246 days.

(21) Appl. No.: 11/491,226

(22) Filed: Jul. 24, 2006

(65) Prior Publication Data

US 2007/0222630 A1      Sep. 27, 2007

(30) Foreign Application Priority Data

Mar. 27, 2006    (JP) ............................. 2006-085830

(51) Int. Cl.
*G08B 21/00*    (2006.01)

(52) U.S. Cl. .................. 340/663; 323/285; 324/522; 324/771; 361/92

(58) Field of Classification Search ............ 340/636.15, 340/660–663, 693.1; 363/50, 74; 361/90, 361/92; 323/281, 285; 324/133, 522, 531, 324/771, 433, 500, 76.77
See application file for complete search history.

(56) References Cited

U.S. PATENT DOCUMENTS 5,196,832 A * 3/1993 Griffin ........................ 340/663

| | | | |
|---|---|---|---|
| 7,091,739 B2 * | 8/2006 | Williams | 324/771 |
| 7,098,799 B2 * | 8/2006 | Imai et al. | 340/660 |
| 7,148,695 B2 * | 12/2006 | Swope et al. | 324/522 |
| 7,369,382 B2 * | 5/2008 | Scheikl et al. | 361/90 |

FOREIGN PATENT DOCUMENTS

JP    07-093066    4/1995

* cited by examiner

*Primary Examiner*—Brent Swarthout
(74) *Attorney, Agent, or Firm*—Staas & Halsey LLP

(57) ABSTRACT

In a power supply monitoring device, a power supply voltage monitoring portion always monitors a power supply voltage supplied to a monitored circuit and outputs a voltage reduction signal when detecting that the power supply voltage is reduced below a predetermined threshold (e.g. a second voltage higher than a voltage guaranteeing a normal operation of the monitored circuit and lower than a rated voltage). A monitoring controller having received the voltage reduction signal determines whether or not an operational malfunction has occurred in the monitored circuit by comparing operation data of the monitored circuit with reference data of the monitoring controller itself. Also, the monitoring controller executes recovery processing (reset processing or reference data overwrite processing) suitable for the monitored circuit referring to a prestored recovery processing type specific to the monitored circuit when detecting an operational malfunction of the monitored circuit.

10 Claims, 14 Drawing Sheets

FIG.10A

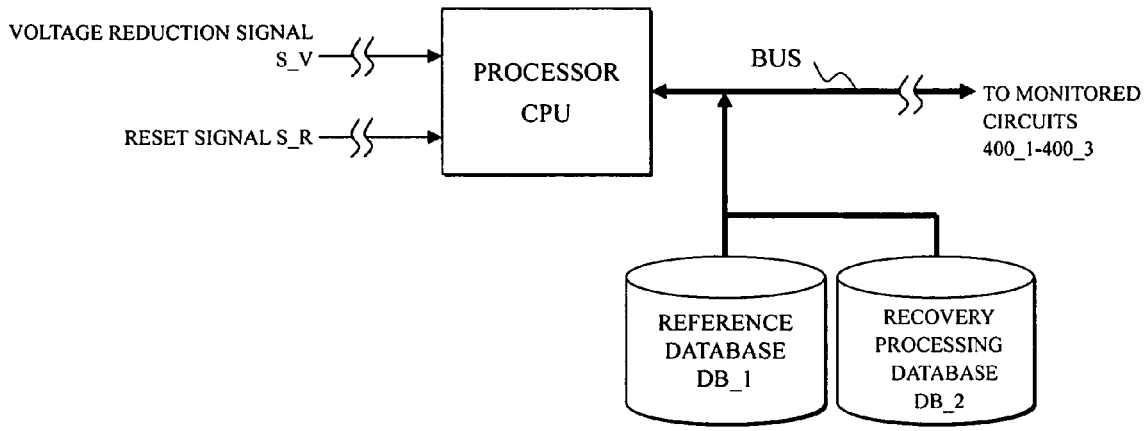

FIG.10B

| MONITORED CIRCUIT NAME | REFERENCE DATA WRITE DESTINATION ADDRESS | REFERENCE DATA |
|---|---|---|
| MONITORED CIRCUIT 400_1 | ADDRESS A1_1 | DATA D1_1 |
|  | ADDRESS A1_2 | DATA D1_2 |
|  | ADDRESS A1_3 | DATA D1_3 |
| MONITORED CIRCUIT 400_2 | ADDRESS A2_1 | DATA D2_1 |
|  | ADDRESS A2_2 | DATA D2_2 |
| MONITORED CIRCUIT 400_3 | ADDRESS A3_1 | DATA D3_1 |
|  | ADDRESS A3_2 | DATA D3_2 |

FIG.10C

| MONITORED CIRCUIT NAME | RECOVERY PROCESSING TYPE |
|---|---|
| MONITORED CIRCUIT 400_1 | RESET PROCESSING |
| MONITORED CIRCUIT 400_2 | REFERENCE DATA OVERWRITE PROCESSING |
| MONITORED CIRCUIT 400_3 | RESET PROCESSING |

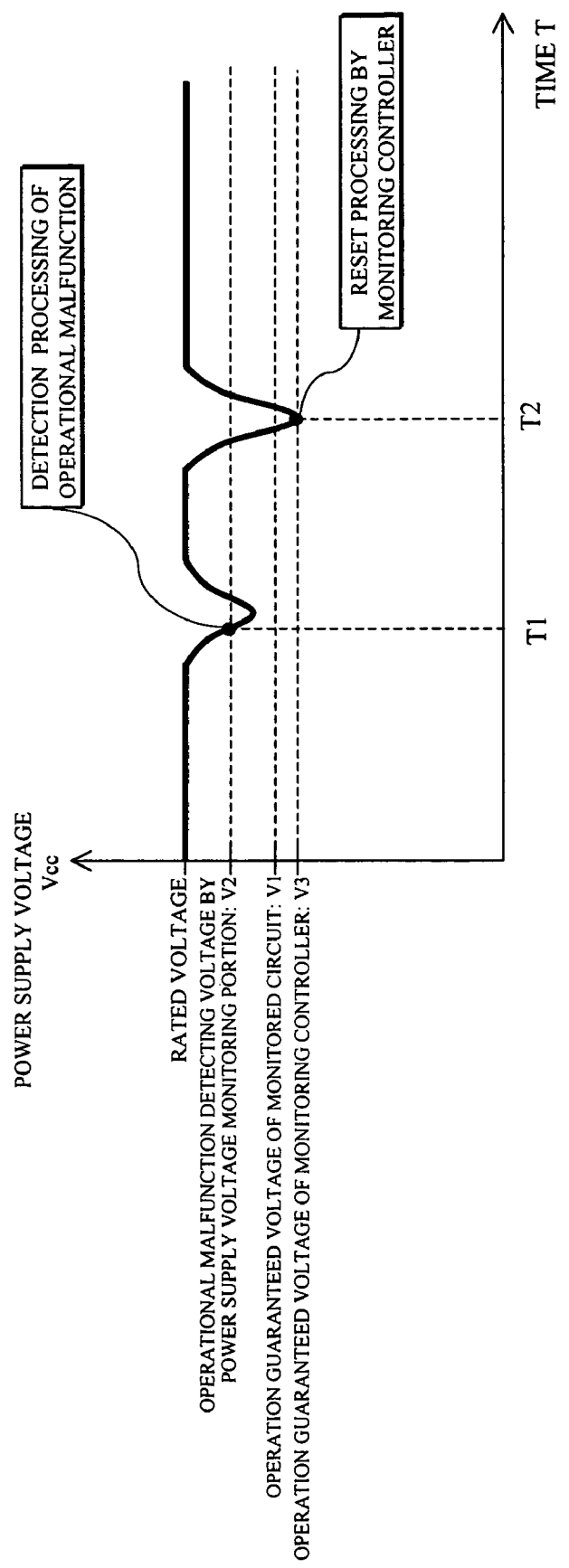

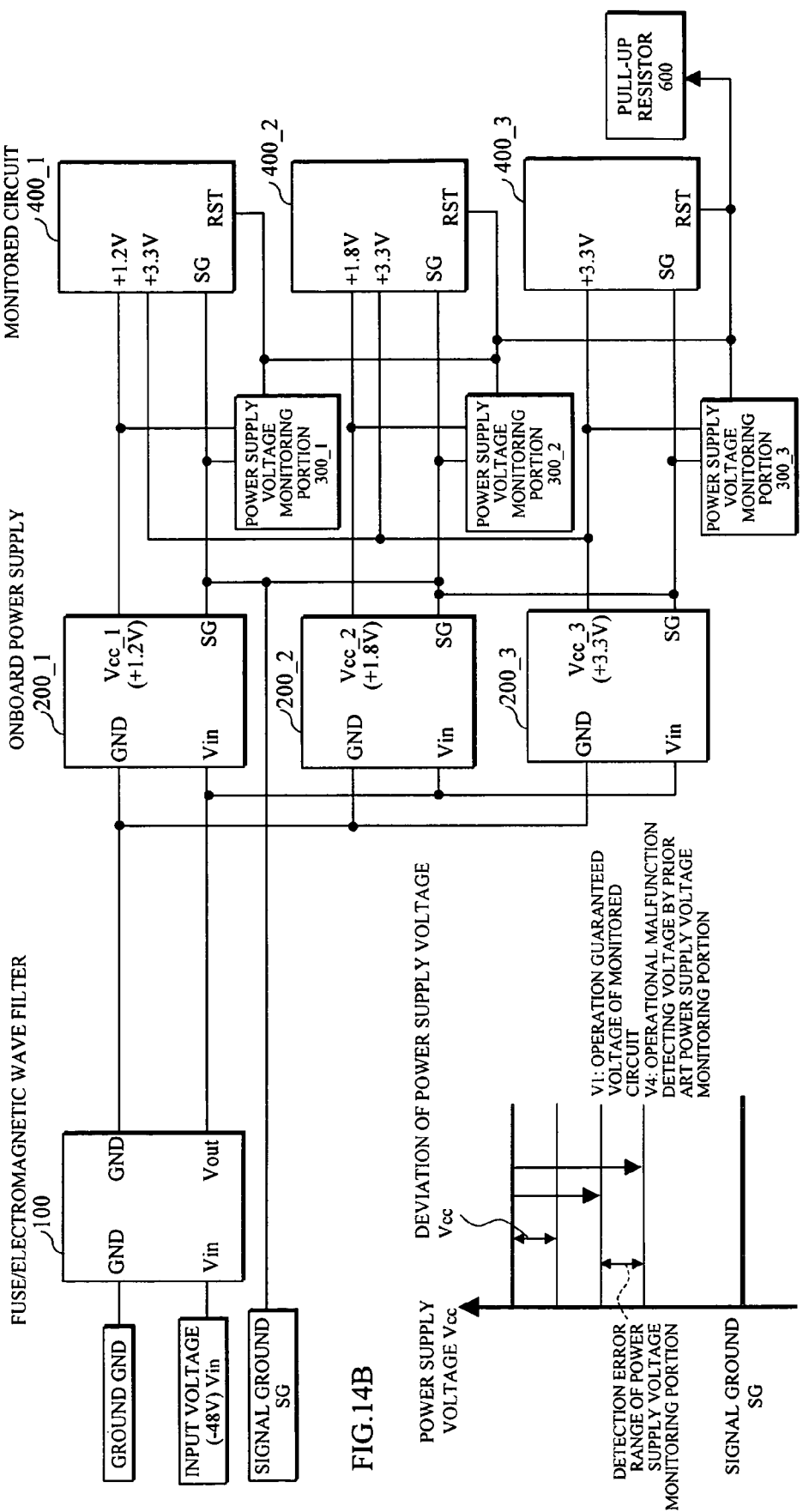

POWER SUPPLY MONITORING DEVICE

BACKGROUND OF THE INVENTION

1. Field of the Invention

The present invention relates to a power supply (or power source) monitoring device, and in particular to a power supply monitoring device monitoring a power supply voltage supplied to a monitored circuit to protect the monitored circuit from an operational malfunction which occurs due to a reduction of the power supply voltage or the like.

2. Description of the Related Art

As the above-mentioned power supply monitoring device, the following prior art examples [1] and [2] have been known.

Prior Art Example [1]: FIGS. 14A and 14B

A power supply monitoring device 10 shown in FIG. 14A is composed of a fuse/electromagnetic wave filter 100 which is connected to a ground GND and is supplied with an input voltage Vin (e.g. "−48 V") for the whole device, onboard power supplies 200_1-200_3 (hereinafter, occasionally represented by a reference numeral 200) respectively receiving an output voltage Vout from the fuse/electromagnetic wave filter 100 as the input voltage Vin and supplying voltages Vcc_1-Vcc_3 (hereinafter, occasionally represented by a reference character Vcc) of e.g. "+1.2 V", "+1.8 V", and "+3.3 V", power supply voltage monitoring portions 300_1-300_3 respectively monitoring the power supply voltages Vcc_1-Vcc_3, a monitored circuit 400_1 operated with the power supply voltages Vcc_1 and Vcc_3, a monitored circuit 400_2 operated with the power supply voltages Vcc_2 and Vcc_3, a monitored circuit 400_3 operated with the power supply voltage Vcc_3, and a pull-up resistor 600 commonly connected to the power supply voltage monitoring portions 300_1-300_3.

Also, the onboard power supplies 200_1-200_3, the power supply voltage monitoring portions 300_1-300_3, and the monitored circuits 400_1-400_3 are commonly connected to a signal ground SG. Each reset input RST of the monitored circuits 400_1-400_3 is commonly connected to each output of the power supply voltage monitoring portions 300_1-300_3.

In operation, as shown in FIG. 14B, the power supply voltage monitoring portions 300 perform reset processing to all of the monitored circuits 400 since there is a possibility that an operational malfunction is occurring in the monitored circuits 400 when any one of the power supply voltages Vcc_1-Vcc_3 is reduced down to a voltage V4 lower than a voltage V1 guaranteeing the operation of the monitored circuits 400.

Thus, it is made possible to protect the monitored circuits 400 from the operational malfunction occurring due to a reduction of the power supply voltage Vcc.

Prior Art Example [2]: (Not Shown)

There is a power supply monitoring device, which will be described referring to FIGS. 14A and 14B. This power supply monitoring device stops an operation of the monitored circuits 400 shown in the above-mentioned prior art example [1] to perform abnormality processing (saving active data in memory or the like) when the power supply voltage Vcc is reduced down to a voltage set higher than the voltage V1 guaranteeing the operation of the monitored circuits 400, and performs the reset processing to the monitored circuits 400 when the power supply voltage Vcc is further reduced down to the voltage V1 (e.g. see patent document 1).

[Patent document 1] Japanese Patent Application Laid-open No. 7-93066

While an IC circuit or the like is generally used for the power supply voltage monitoring portion in the prior art example [1] shown in FIG. 14A, there are variations (detection errors) for a detection accuracy of the power supply voltage per circuit.

In consideration of such detection errors, in the above-mentioned prior art example [1], the power supply voltage monitoring portion sets a voltage detecting a malfunction of the monitored circuit so as to have a margin for errors, compared with a voltage guaranteeing the operation of the monitored circuit. Therefore, there has been a problem that an occurrence of an operational malfunction in the monitored circuit can not be instantaneously detected by the reduction of the power supply voltage, and services provided by the device are kept stopped for a long time.

Also, in the above-mentioned prior art example [2], the operation of the monitored circuit is stopped at the time when the power supply voltage is reduced down to the voltage set higher than the voltage guaranteeing the operation of the monitored circuit. Therefore, when the power supply voltage is instantaneously interrupted, suddenly reduced, or the like (namely, when the monitored circuit recovers after the power supply voltage is reduced down to the voltage for stopping the operation of the monitored circuit, but not to the voltage for performing the reset processing to the monitored circuit), the operation of the monitored circuit is kept stopped regardless of the presence or absence of the operational malfunction. Consequently, there has been a problem that the services provided by the device are stopped even when stopping the services is not necessary.

SUMMARY OF THE INVENTION

It is accordingly an object of the present invention to provide a power supply monitoring device which can accurately and quickly detect an operational malfunction which occurs in a monitored circuit due to an instantaneous interruption of a power supply voltage, a sudden reduction thereof, or the like without stopping services provided by the device for a long time.

[1] In order to achieve the above-mentioned object, a power supply monitoring device according to one aspect of the present invention comprises: a power supply voltage monitoring portion monitoring a power supply voltage supplied to a monitored circuit and outputting a voltage reduction signal when detecting that the power supply voltage is reduced below a predetermined threshold; and a monitoring controller determining whether or not an operational malfunction has occurred in the monitored circuit by comparing operation data of the monitored circuit with reference data held by the monitoring controller itself upon receiving the voltage reduction signal.

Such a power supply monitoring device will now be described by referring to a principle shown by a thick solid line in FIG. 1A, to which, however, the present invention is not limited.

A power supply voltage monitoring portion 300 always monitors a voltage Vcc supplied to a monitored circuit 400. The power supply voltage monitoring portion 300 outputs a voltage reduction signal S_V when detecting that the power supply voltage Vcc is reduced below a predetermined threshold.

A monitoring controller 500, specifically a circuit examining portion 510 within the monitoring controller 500, having received the voltage reduction signal S_V determines whether or not an operational malfunction has occurred in the monitored circuit 400 by comparing operation data of the monitored circuit 400 with reference data held by the controller 500 itself.

Namely, when an operational malfunction has occurred in the monitored circuit 400 due to an instantaneous interruption of the power supply voltage Vcc, a sudden reduction thereof, or the like, the contents of the operation data within the monitored circuit 400 are to be lost, or garbled (changed) by the influence of the operational malfunction. By using this fact, i.e. by recognizing inconsistency therebetween by comparing the operation data with the reference data held by the controller 500 itself, the monitoring controller 500 detects an occurrence of an operational malfunction in the monitored circuit 400. When the operation data is consistent with the reference data, the monitoring controller 500 does not determine that the operational malfunction is occurring in the monitored circuit 400. In other words, the monitoring controller 500 compares the operation data of the monitored circuit 400 with the reference data held by the controller 500 itself when receiving the voltage reduction signal S_V, determines that the monitored circuit 400 is operating normally when both are consistent, and determines that the monitored circuit 400 is operating abnormally when both are inconsistent.

Thus, in the power supply monitoring device according to one aspect of the present invention, it becomes possible to accurately detect an operational malfunction which occurs in the monitored circuit due to an instantaneous interruption of the power supply voltage, a sudden reduction thereof, or the like without stopping services provided by the device.

[2] Also, in the above-mentioned [1], the threshold may comprise a second voltage higher than a first voltage guaranteeing a normal operation of the monitored circuit and lower than a rated voltage.

Namely, as shown in FIG. 1B for example, the threshold may be a voltage V2 which is higher than a voltage V1 guaranteeing a normal operation of the monitored circuit 400 and lower than a rated voltage.

Thus, the power supply voltage Vcc reaches the voltage V2 before it reaches the voltage V1. Therefore, it is possible to more quickly detect an operational malfunction which occurs in the monitored circuit.

[3] Also, in the above-mentioned [1], the monitoring controller may include means performing, when determining that the operational malfunction has occurred, reset processing according to a recovery processing type specific to the monitored circuit prestored for the monitored circuit or overwrite processing of the reference data for the operation data for controlling the monitored circuit.

Namely, as shown by a thick dotted line in FIG. 1A, a circuit setting portion 520 within the monitoring controller 500 refers a recovery processing type specific to the monitored circuit 400 prestored in e.g. a memory (not shown) in order to perform recovery processing suitable for the monitored circuit 400 when the circuit examining portion 510 detects an operational malfunction of the monitored circuit 400.

As a result, when recognizing that the monitored circuit 400 is a circuit recoverable by performing the reset processing, for example, the circuit setting portion 520 executes the reset processing to the monitored circuit 400. Also, when the monitored circuit 400 is a circuit recoverable by rewriting the reference data designating the control, the circuit setting portion 520 executes overwrite processing of the reference data to the operation data of the monitored circuit 400.

Thus, it is possible to perform the recovery processing suitable for the circuit, when an operational malfunction of the monitoring circuit 400 is detected.

[4] Also, in the above-mentioned [2], the power supply monitoring device may further comprise a second power supply voltage monitoring portion outputting a reset signal to the monitoring controller when detecting that the power supply voltage is reduced down to a third voltage lower than the first voltage, and the monitoring controller may include means performing reset processing to the monitoring controller itself upon receiving the reset signal.

Namely, as shown in the principle diagram [2] of FIGS. 2A and 2B, the power supply monitoring device 10 shown in FIG. 2A is provided with a power supply voltage monitoring portion 300_2 monitoring whether or not the power supply voltage Vcc is reduced down to a voltage V3 (see FIG. 2B) lower than the voltage V1 guaranteeing the normal operation of the monitored circuit 400, in addition to the arrangement shown in FIG. 1A.

When detecting that the power supply voltage Vcc is reduced down to the voltage V3, the power supply voltage monitoring portion 300_2 outputs a reset signal S_R to the monitoring controller 500. This is because when the power supply voltage Vcc is reduced down to the voltage V3, there is a possibility that the voltage reduction leads to an occurrence of an operational malfunction not only in the monitored circuit 400 but also in the monitoring controller 500 itself.

The monitoring controller 500 having received the reset signal S_R performs the reset processing to the controller 500 itself, and autonomously recovers the controller 500 itself from the operational malfunction. Thus, even when the operational malfunction has occurred in the monitoring controller 500, the monitoring controller 500 can restart and continue the detection of the operational malfunction which occurs in the monitored circuit 400.

[5] Also, in the above-mentioned [1], a plurality of power supply voltage monitoring portions and power supply voltages may be provided, in which each of the power supply voltage monitoring portions is provided for each of the power supply voltages, and the monitoring controller may determine whether or not an operational malfunction has occurred in the monitored circuit upon receiving the voltage reduction signal from any one of the power supply voltage monitoring portions.

Namely, as shown in the principle diagram [3] of FIG. 3, when "n" power supply voltages Vcc_1-Vcc_n are supplied to a single monitored circuit 400, the power supply voltage monitoring portions 300_1-300_n which are the same as that in the above-mentioned [1] are respectively installed for each of the power supply voltages Vcc_1-Vcc_n.

The monitoring controller 500 having received the voltage reduction signal S_V from any one of the power supply voltage monitoring portions 300_1-300_n determines whether or not the operational malfunction has occurred in the monitored circuit 400 in the same way as the above-mentioned [1].

Thus, even when a plurality of power supply voltages are supplied to the monitored circuit, it is possible to detect an operational malfunction which occurs in the monitored circuit due to an instantaneous interruption of the power supply voltage, a sudden reduction thereof, or the like without stopping the services provided by the device.

[6] Also, in the above-mentioned [1], a plurality of power supply voltage monitoring portions may be provided, each of which is provided so as to monitor each of monitored circuits in parallel, and the monitoring controller may determine whether or not an operational malfunction has occurred for each of the monitored circuits respectively upon receiving the voltage reduction signal from any one of the power supply voltage monitoring portions.

Namely, as shown in the principle diagram [4] of FIG. 4, when a single common power supply voltage Vcc is commonly supplied to "n" units of monitored circuits 400_1-400_n in parallel, the power supply voltage monitoring portions 300_1-300_n are installed so as to monitor the monitored circuits 400_1-400_n in parallel in the same way as the above-mentioned [1]. This is because there is a possibility that voltage values actually supplied to the monitored circuits 400_1-400_n are different according to an install condition (i.e. various conditions such as a voltage drop due to a distance difference to the monitored circuit 400 from the power supply and a difference of the power consumption by another circuit (not shown) installed before and after the monitored circuit 400) of each of the monitored circuits 400_1-400_n, even if the common power supply voltage Vcc is supplied to the monitored circuits 400_1-400_n respectively.

The monitoring controller 500 having received the voltage reduction signal S_V from any one of the power supply voltage monitoring portions 300_1-300_n determines whether or not the operational malfunction has occurred for each of the monitored circuits 400_1-400_n in the same way as the above-mentioned [1].

Thus, even when a common power supply voltage is supplied to a plurality of monitored circuits, any of the power supply voltage monitoring portions detects an instantaneous interruption of the power supply voltage, a sudden reduction thereof, or the like, thereby enabling an operational malfunction which occurs in each of the monitored circuits to be detected without stopping services provided by the device.

[7] Also, in the above-mentioned [1], the power supply monitoring device may further comprise a timer portion instructing the monitoring controller to periodically determine whether or not an operational malfunction has occurred in the monitored circuit.

Namely, as shown in the principle diagram [5] of FIGS. 5A and 5B, the power supply monitoring device 10 shown in FIG. 5A is provided with a timer portion 530 notifying a time-out to the monitoring controller 500 in addition to the arrangement shown in FIG. 1A.

As shown in FIG. 5B, the monitoring controller 500 requests the timer portion 500 to start the timer upon initial startup (at step S1).

When receiving the voltage reduction signal S_V from the power supply voltage monitoring portion 300 (at step S2), the monitoring controller 500 determines whether or not an operational malfunction has occurred in the monitored circuit 400 in the same way as the above-mentioned [1] (at step S3).

On the other hand, when receiving a notice of a time-out from the timer portion 530 (at step S4), the monitoring controller 500 determines whether or not an operational malfunction has occurred in the monitored circuit 400 in the same way as the above-mentioned [1] (at step S3), and requests the timer portion 500 to restart the timer (at step S5).

Hereafter, the monitoring controller 500 repeatedly executes the above-mentioned steps S2-S5 every time the controller receives the voltage reduction signal S_V or the notice of the time-out.

Thus, it is possible to detect by periodically monitoring the operational malfunction which occurs in the monitored circuit 400, even when the reduction of the power supply voltage Vcc is not detected.

[8] Also, in the above-mentioned [1], the monitoring controller may include means writing the reference data prestored for controlling the monitored circuit in a register of the monitored circuit upon initial startup, and means reading the reference data from the register as the operation data upon receiving the voltage reduction signal from the power supply voltage monitoring portion, and comparing the operation data read with the reference data stored to determine that the operational malfunction has occurred when both are inconsistent.

[9] Also, in the above-mentioned [1], the monitoring controller may include means calculating a checksum or a CRC of the reference data to be stored inside the monitoring controller every time the monitoring controller writes the reference data prestored for controlling the monitored circuit in a register of the monitored circuit upon initial startup, and means reading the reference data from the register as the operation data upon receiving the voltage reduction signal from the power supply voltage monitoring portion, and comparing a check sum or a CRC calculated from the operation data read with the check sum or the CRC stored to determine that the operational malfunction has occurred when both are inconsistent.

[10] Also, in the above-mentioned [1], the monitoring controller may include means calculating a parity bit from the reference data prestored for controlling the monitored circuit upon initial startup, and writing the calculated parity bit and the reference data in the register of the monitored circuit, and means reading from the register the parity bit and the reference data as the operation data upon receiving the voltage reduction signal from the power supply voltage monitoring portion, and determining that the operational malfunction has occurred when checking the operation data read by using the parity bit read to detect a parity error.

According to the present invention, the operational malfunction which occurs in the monitored circuit due to an instantaneous interruption of the power supply voltage, a sudden reduction thereof, or the like can be accurately and quickly detected without stopping services provided by the device for a long time, thereby enabling a reliability of the whole device to be improved.

Also, since the recovery processing can be performed when the operational malfunction of the monitored circuit is detected, an availability of the whole device can be improved.

Furthermore, when a plurality of power supply voltages are supplied to the monitored circuit, or when a common power supply voltage is supplied to a plurality of monitored circuits, an operational malfunction which occurs in the monitored circuit can be detected, thereby enabling the present invention to be applied to development of a large scale device or the like.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which:

FIGS. 10A-10C are block diagrams showing an arrangement of a monitoring controller used for an embodiment [4] of a power supply monitoring device according to the present invention;

FIG. 11 is a time transition graph of a power supply voltage showing an overall operation example of an embodiment [4] of a power supply monitoring device according to the present invention;

FIGS. 14A and 14B are block diagrams showing a prior art example [1] of a power supply monitoring device.

DESCRIPTION OF THE EMBODIMENTS

Hereinafter, embodiments [1]-[5] of the power supply monitoring device according to the present invention will be described referring to FIGS. 6-9, 10A-10C, and 11-13 respectively. It is to be noted that the embodiments [1]-[3] are included in the principle diagram of FIGS. 1A and 1B, the embodiment [4] is indicated by the combination of the principle diagrams of FIGS. 1A, 1B, 2A, 2B, and 3, and the embodiment [5] is indicated by the combination of the principle diagrams of FIGS. 1A, 1B, 3, and 4.

Figure 1A:
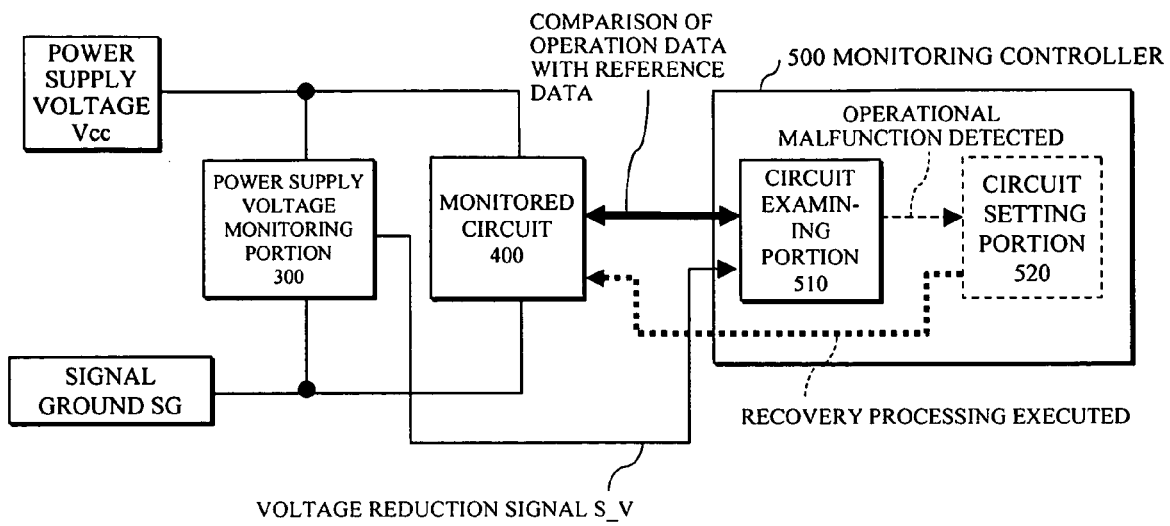
FIGS. 1A and 1B are block diagrams showing a principle [1] of a power supply monitoring device according to the present invention.
Figure 1B:
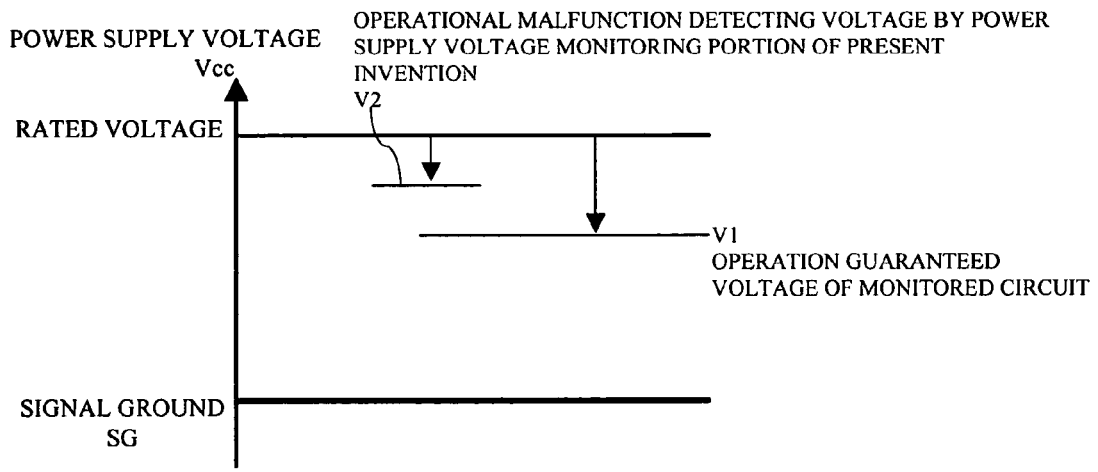
Figure 6:
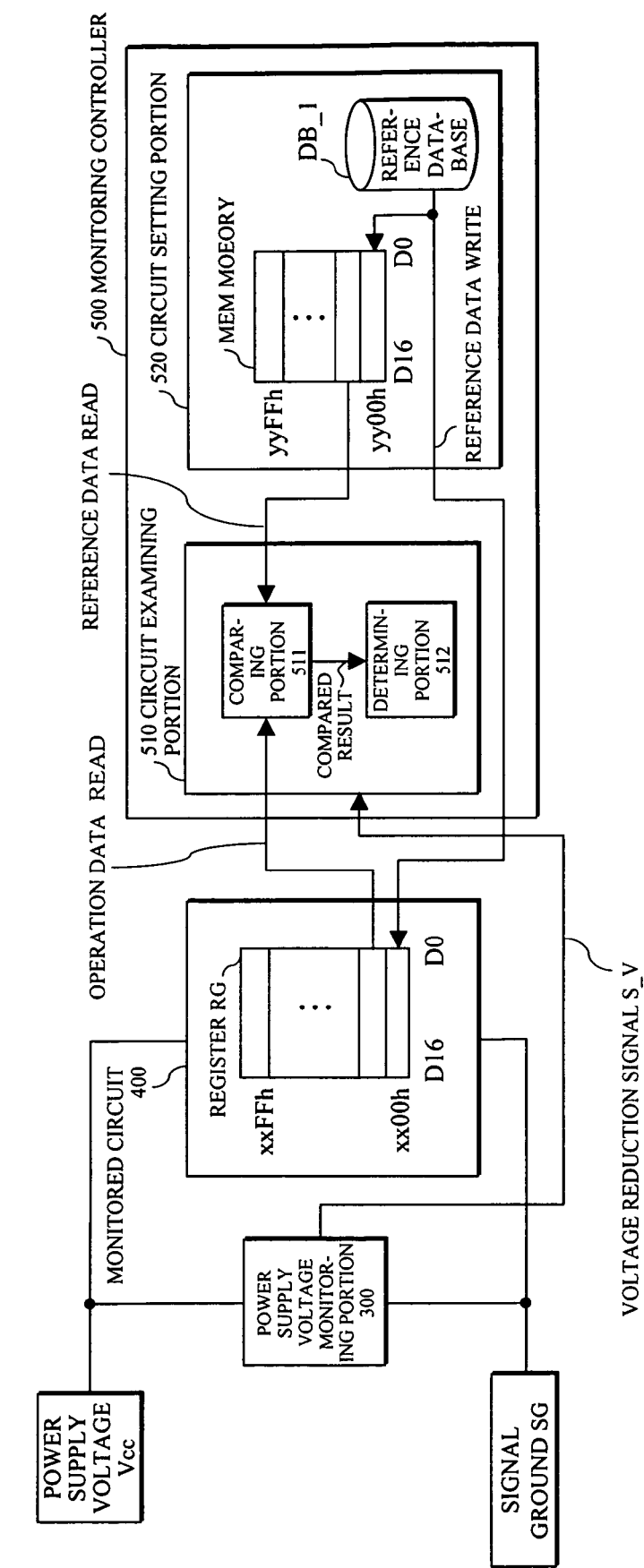
FIG. 6 is a block diagram showing an embodiment [1] of a power supply monitoring device according to the present invention.

Embodiment [1]: FIGS. 1A, 1B, and 6

The power supply monitoring device 10 shown in FIG. 6 is composed of the power supply voltage (unit) Vcc, the power supply voltage monitoring portion 300, the monitored circuit 400, and the monitoring controller 500 including the circuit examining portion 510 and the circuit setting portion 520, in the same way as FIG. 1A.

Furthermore, in addition to the arrangement shown in FIG. 1A, the monitored circuit 400 is provided with a register RG for writing therein reference data which becomes operation data during operation.

Also, the circuit examining portion 510 is provided with a comparing portion 511 comparing the operation data of the monitored circuit 400 with the reference data of the circuit examining portion 510 itself, a determining portion 512 determining presence or absence of an operational malfunction of the monitored circuit 400 based on the comparison result of the comparing portion 511. The circuit setting portion 520 is provided with a reference database DB_1 storing the reference data and a memory MEM.

In operation, upon the initial startup, the circuit setting portion 520 writes the reference data for controlling the monitored circuit 400 stored in the reference database DB_1 in the memory MEM inside the circuit setting portion 520 and the register RG of the monitored circuit 400.

During the operation, the power supply voltage monitoring portion 300 always monitors the voltage Vcc supplied to the monitored circuit 400. When detecting that the power supply voltage Vcc is reduced down to the voltage V2 which is higher than the voltage V1 guaranteeing the normal operation of the monitored circuit 400 and lower than the rated voltage, the power supply voltage monitoring portion 300 provides the voltage reduction signal S_V to the circuit examining portion 510.

The comparing portion 511 within the circuit examining portion 510 having received the voltage reduction signal S_V reads the reference data written in the register RG of the monitored circuit 400 as the operation data, reads the reference data written in the memory MEM, and compares the operation data read with the reference data read.

When the comparison result indicates inconsistency, the determining portion 512 determines that an operational malfunction has occurred in the monitored circuit 400.

Figure 7:
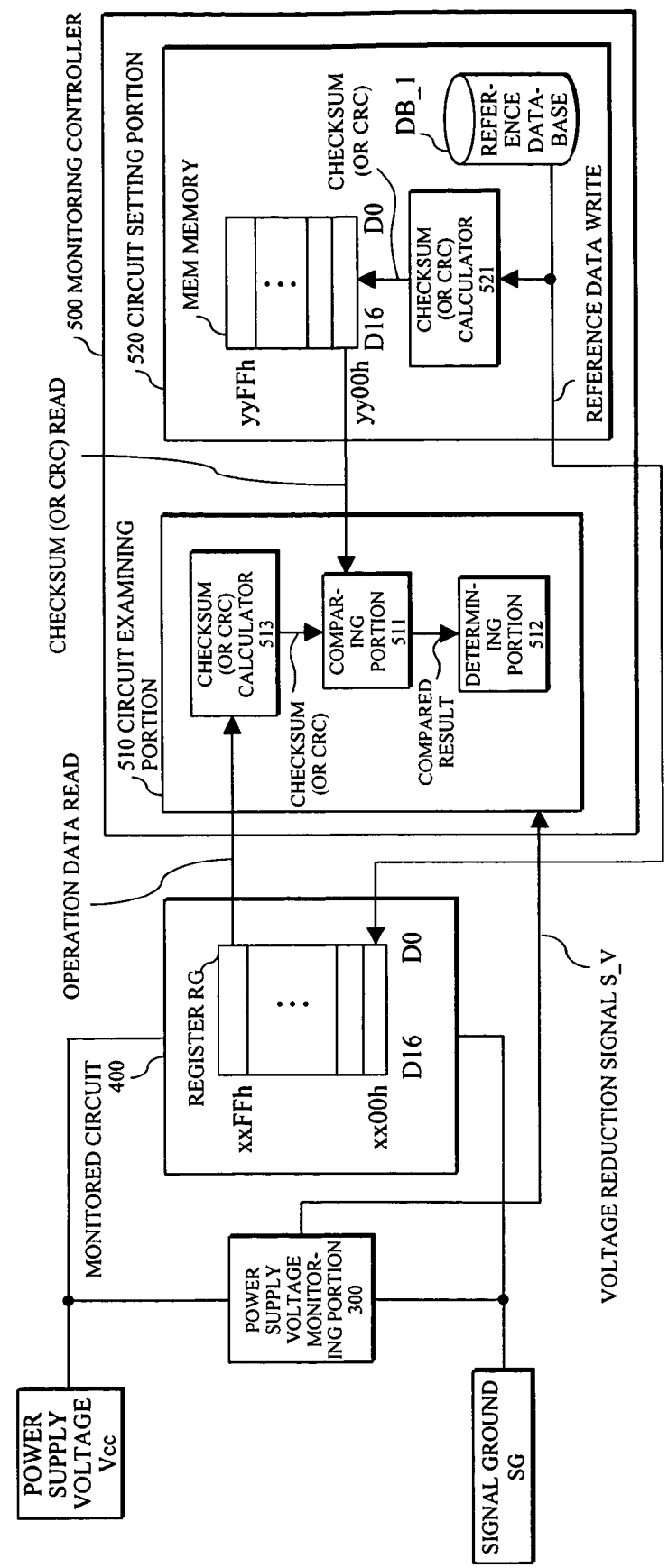
FIG. 7 is a block diagram showing an embodiment [2] of a power supply monitoring device according to the present invention.

Embodiment [2]: FIGS. 1A, 1B, and 7

The power supply monitoring device 10 shown in FIG. 7 is arranged so that the circuit examining portion 510 includes a checksum (or CRC) calculator 513 calculating a checksum or CRC from the operation data of the monitored circuit 400, and the circuit setting portion 520 includes a checksum (or CRC) calculator 521 calculating a checksum or CRC from the reference data stored in the reference database DB_1, in addition to the arrangement of the above-mentioned embodiment [1].

In operation, upon the initial startup, the checksum (or CRC) calculator 521 calculates the checksum or CRC of the reference data to be stored in the memory MEM every time the calculator 521 writes the reference data for controlling the monitored circuit 400 stored in the reference database DB_1 in the register RG of the monitored circuit 400.

When receiving the above-mentioned voltage reduction signal S_V from the power supply voltage monitoring portion 300 during operation, the checksum (or CRC) calculator 513 within the circuit examining portion 510 reads the reference data written in the register RG of the monitored circuit 400 as the operation data and calculates the checksum or CRC from the operation data read.

The comparing portion 511 compares the checksum or CRC calculated by the checksum (or CRC) calculator 513 with the checksum or CRC stored in the memory MEM.

When the comparison result indicates inconsistency, the determining portion 512 determines that the operational malfunction has occurred in the monitored circuit 400.

Figure 8:
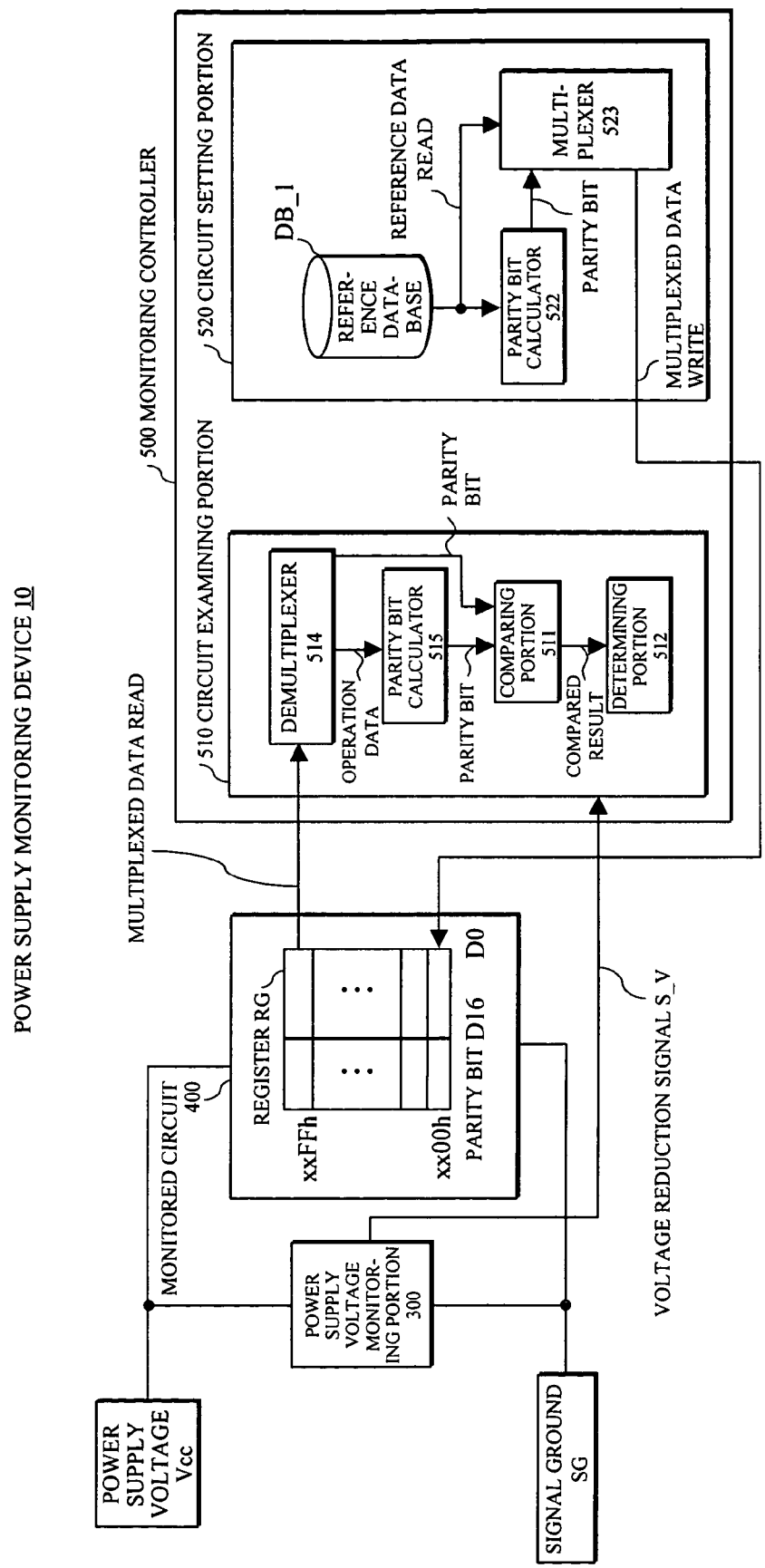
FIG. 8 is a block diagram showing an embodiment [3] of a power supply monitoring device according to the present invention.

Embodiment [3]: FIGS. 1A, 1B, and 8

The power supply monitoring device 10 shown in FIG. 8 is arranged so that the circuit setting portion 520 includes a parity bit calculator 522 calculating a parity bit from the reference data stored in the reference database DB_1 and a multiplexer 523 multiplexing the parity bit calculated by the parity bit calculator 522 and the reference data to be written in the register RG of the monitored circuit 400, and the circuit examining portion 510 includes a demultiplexer 514 demultiplexing the multiplexed data of the monitored circuit 400 into the operation data and the parity bit, and a parity bit calculator 515 calculating a parity bit from the operation data provided from the demultiplexer 514, in addition to the arrangement of the above-mentioned embodiment [1].

Different from the above-mentioned embodiment [1], the circuit setting portion 520 is not provided with the memory MEM.

In operation, the parity bit calculator 522 calculates a parity bit from the reference data for controlling the monitored circuit 400 stored in the reference database DB_1 to be provided to the multiplexer 523 upon the initial startup. The multiplexer 523 multiplexes the parity bit and the reference data to be written in the register RG of the monitored circuit 400.

When receiving the above-mentioned voltage reduction signal S_V from the power supply voltage monitoring portion 300 during operation, the demultiplexer 514 within the circuit examining portion 510 provided in the monitoring controller 500 demultiplexes the multiplexed data written in the register RG of the monitored circuit 400 into the parity bit and the reference data as the operation data, the parity bit is provided to the comparing portion 511, and the operation data is provided to the parity bit calculator 515.

Also, the parity bit calculator 515 having received the operation data calculates the parity bit from the operation data to be provided to the comparing portion 511.

The comparing portion 511 compares the parity bit received from the demultiplexer 514 with the parity bit received from the parity bit calculator 515.

When the comparison result indicates inconsistency, the determining portion 512 determines that the operational malfunction has occurred in the monitored circuit 400.

Embodiment [4]: FIGS. 1A, B, 2A, 2B, 3, 9, 10A-10C, 11, and 12

[4]-1 Arrangement: FIGS. 9, and 10A-10C

Figure 9:
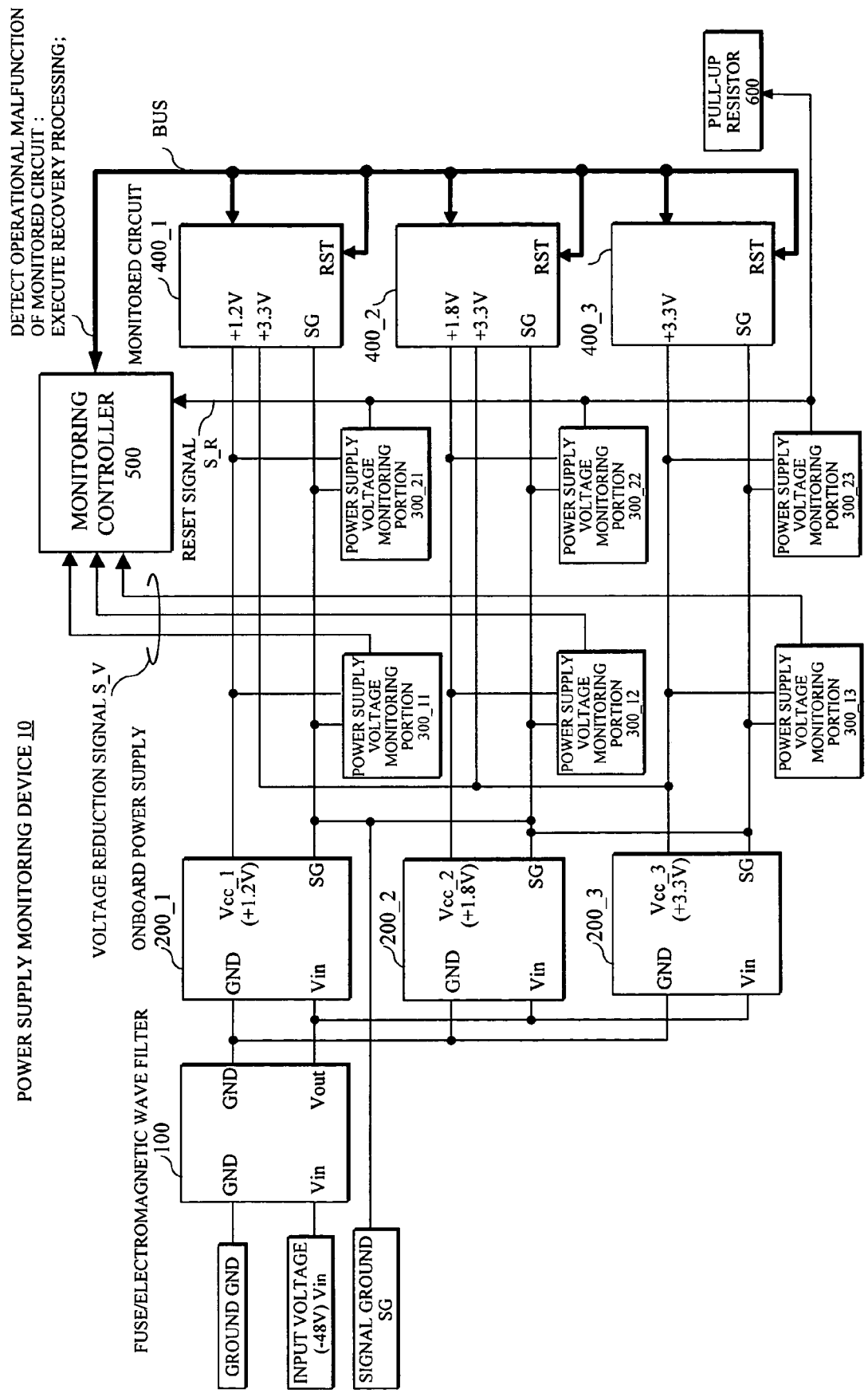
FIG. 9 is a block diagram showing an embodiment [4] of a power supply monitoring device according to the present invention.

Whole Arrangement: FIG. 9

Figure 2A:
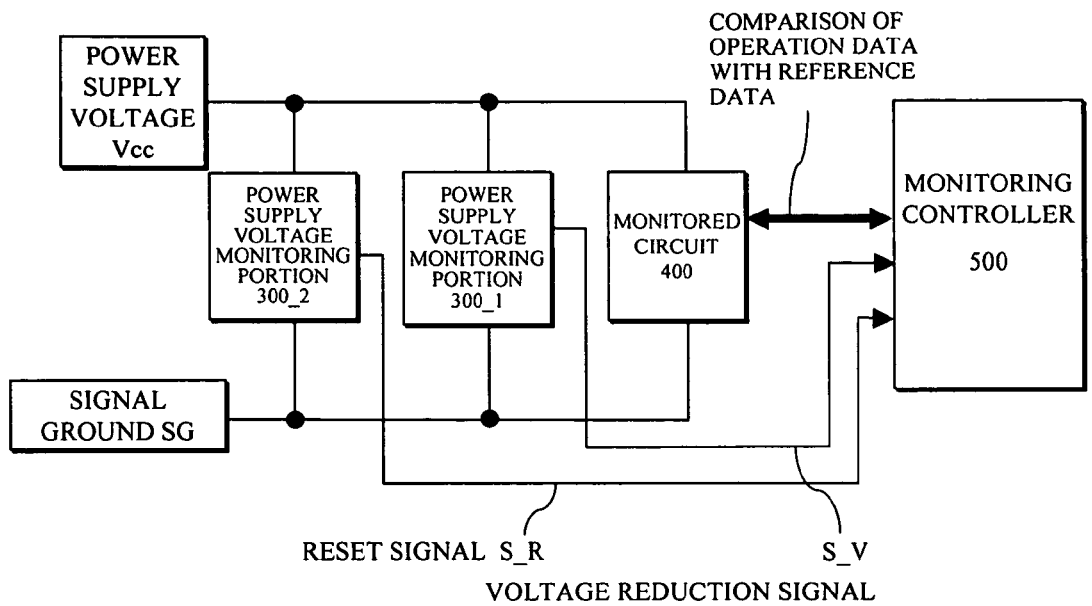
FIGS. 2A and 2B are block diagrams showing a principle [2] of a power supply monitoring device according to the present invention.
Figure 2B:
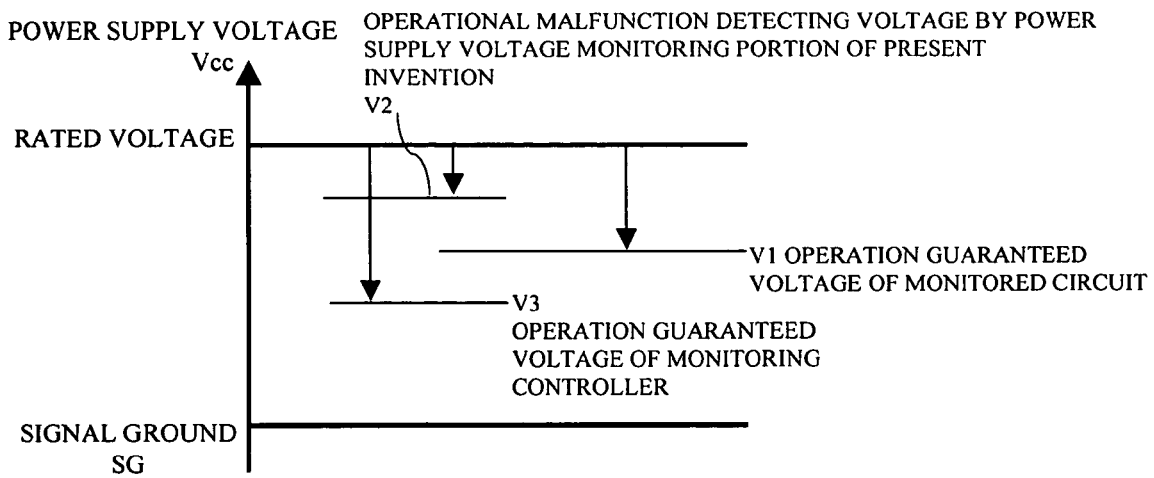
Figure 3:
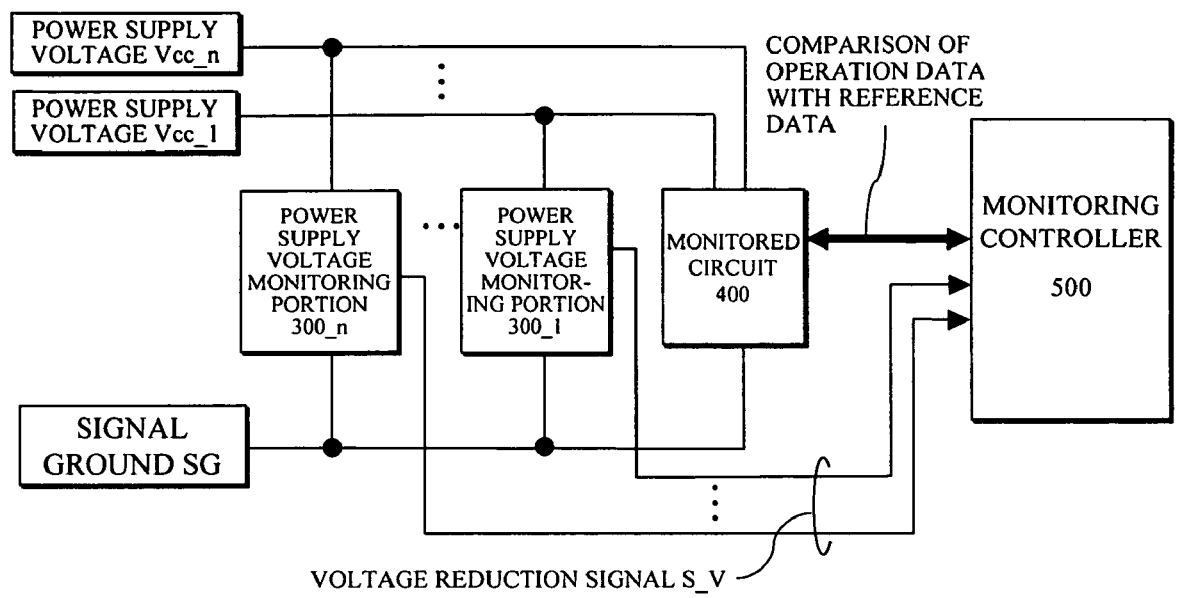
FIG. 3 is a block diagram showing a principle [3] of a power supply monitoring device according to the present invention.
Figure 4:
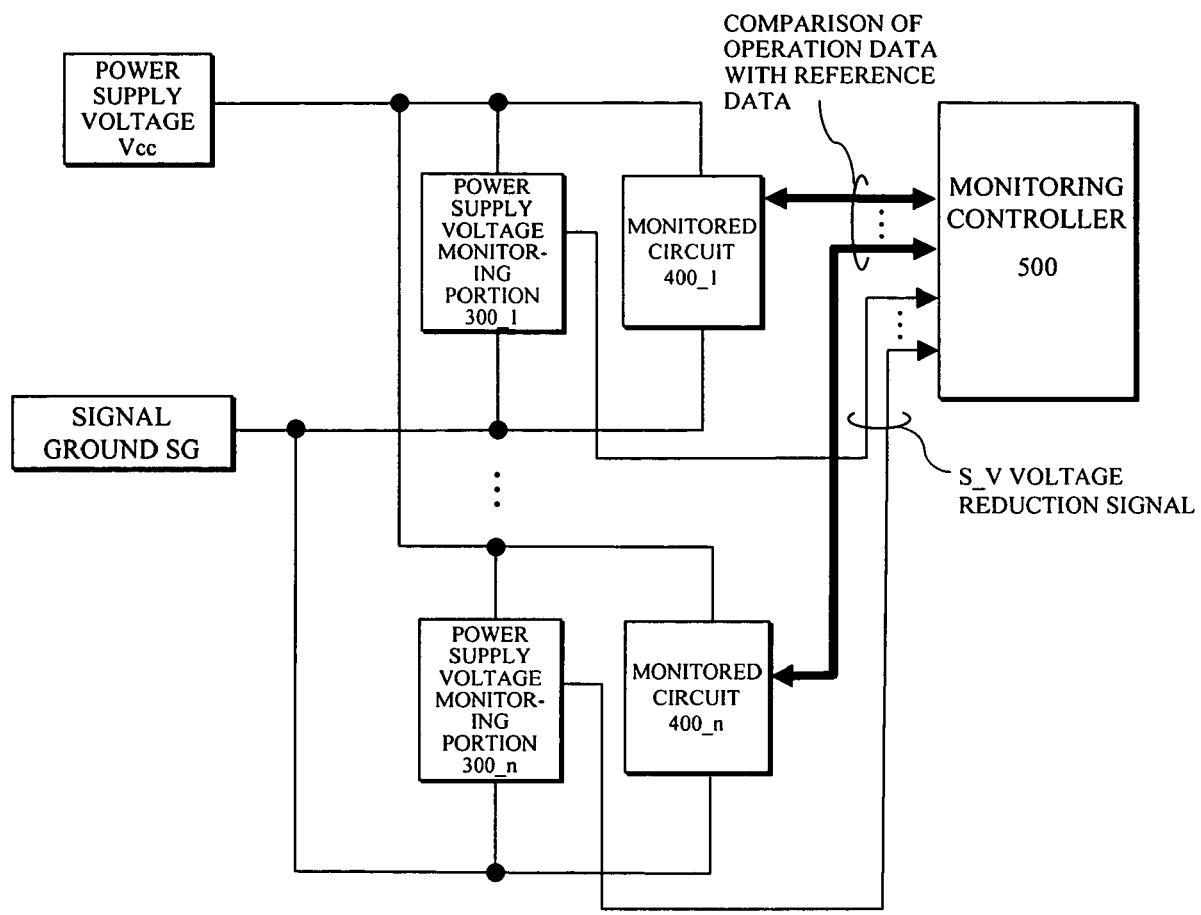
FIG. 4 is a block diagram showing a principle [4] of a power supply monitoring device according to the present invention.

The power supply monitoring device 10 shown in FIG. 9 is composed of a fuse/electromagnetic wave filter 100 which is connected to a ground GND and is supplied with an input voltage Vin (e.g. "−48 V") for the whole device, onboard power supplies 200_1-200_3 respectively receiving an output voltage Vout from the fuse/electromagnetic wave filter 100 as an input voltage Vin and supplying power supply voltages Vcc_1-Vcc_3 of e.g. "+1.2 V", "+1.8 V", and "+3.3 V", power supply voltage monitoring portions 300_11-300_13 15 respectively monitoring the voltage V2 shown in FIG. 1B for the power supply voltages Vcc_1-Vcc_3, power supply voltage monitoring portions 300_21-300_23 respectively monitoring the voltage V3 shown in FIG. 2B for the power supply voltages Vcc_1-Vcc_3, the monitored circuit 400_1 operated with the power supply voltages Vcc_1 and Vcc_3, the monitored circuit 400_2 operated with the power supply voltages Vcc_2 and Vcc_3, the monitored circuit 400_3 operated with the power supply voltage Vcc_3, the monitoring controller 500 performing an operational malfunction detection of the monitored circuits 400_1-400_3 and recovery processing for the monitored circuits 400_1-400_3, and a pull-up resistor 600 commonly connected to the power supply voltage monitoring portions 300_21-300_23.

Also, the onboard power supplies 200_1-200_3, the power supply voltage monitoring portions 300_11-300_13, 300_21-300_23, and the monitored circuits 400_1-400_3 are commonly connected to a signal ground SG. The monitoring controller 500, the monitored circuits 400_1-400_3, and the reset inputs RST of the monitored circuits 400_1-400_3 are mutually connected with a bus BUS.

Arrangement of Monitoring Controller: FIGS. 10A, 10B, and 10C

The monitoring controller 500 shown in FIG. 10A is composed of a processor CPU receiving the voltage reduction signal S_V from the power supply voltage monitoring portions 300_11-300_13 shown in FIG. 9 and the reset signal S_R from the power supply voltage monitoring portions 300_21-300_23, a reference database DB_1 and a recovery processing database DB_2 connected with the bus BUS so as to be referred from the processor CPU.

In the above-mentioned reference database DB_1, as shown in e.g. FIG. 10B, reference data write destination addresses A1_1-A3_2 (namely, addresses of the register RG within the monitored circuits 400_1-400_3 shown in FIG. 7) corresponding to the monitored circuits 400_1-400_3, and reference data D1_1-D3_2 to be written in the addresses are stored. The monitoring controller 500 writes, upon the initial startup, the addresses A1_1-A3_2 of the register RG corresponding to the reference data D1_1-D3_2.

Also, in the above-mentioned recovery processing database DB_2, as shown in e.g. FIG. 10C, either the reset processing or reference data overwrite processing is stored as a recovery processing type corresponding to the monitored circuits 400_1-400_3.

Figure 12:
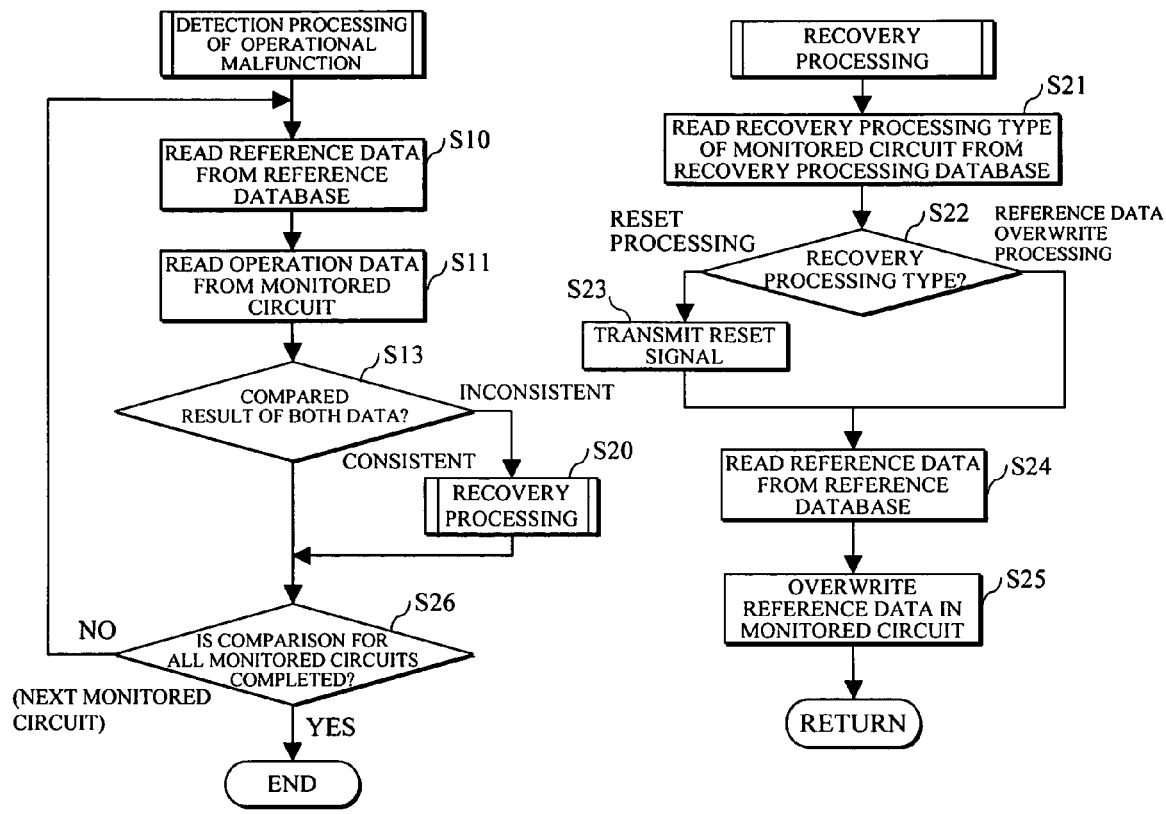
FIG. 12 is a flow chart showing a detection processing example of an operation malfunction of a monitoring controller used for an embodiment [4] of a power supply monitoring device according to the present invention.

[4]-2 Operation Example: FIGS. 11 and 12

Whole Operation: FIG. 11

FIG. 11 shows a graph of a time transition of the power supply voltage Vcc (Vcc_1-Vcc_3) shown in FIG. 9. Hereinafter, the whole operation of the power supply monitoring device 10 will be described by referring to this graph.

Supposing that, at a time T1, the power supply voltage Vcc_1 where the same applies to the power supply voltages Vcc_2 and Vcc_3 is reduced down to the voltage V2 higher than the voltage V1 guaranteeing a normal operation of the monitored circuit 400_1 and lower than the rated voltage where the rated voltage of the power supply voltages Vcc_1-Vcc_3 are respectively "+1.2 V", "+1.8 V", and "+3.3 V", the power supply voltage monitoring portion 300_11 where the same applies to the power supply voltage monitoring portions 300_12 and 300_13 detects the reduction to provide the voltage reduction signal S_V to the monitoring controller 500.

The monitoring controller 500 having received the voltage reduction signal S_V performs an operational malfunction detecting processing described later.

Also, supposing that, at a time T2, the power supply voltage Vcc_1 is reduced down to the voltage V3 guaranteeing a normal operation of the monitoring controller 500 whose voltage Vcc_1 is lower than the voltage V1, the power supply voltage monitoring portion 300_21 where the same applies to the power supply voltage monitoring portions 300_22 and 300_23 detects the reduction to provide the reset signal S_R to the monitoring controller 500.

The monitoring controller 500 having received the reset signal S_R executes the reset processing to the controller 500 itself to autonomously recover the operational malfunction.

Operational Malfunction Detection Processing: FIG. 12

Firstly, the processor CPU within the monitoring controller 500 having received the voltage reduction signal S_V from e.g. the power supply voltage monitoring portion 300_11 reads the reference data D1_1-D1_3 corresponding to the monitored circuit 400_1 from the reference database DB_1 shown in FIG. 10A (at step S10).

The processor CPU reads the reference data D1_1-D1_3 written upon the initial startup from the reference data write destination addresses A1_1-A1_3 of the register RG within the monitored circuit 400_1 as operation data (at step S11).

The processor CPU compares the reference data read from the reference database DB_1 with the operation data read from the monitored circuit 400_1 (at step S13). When the comparison result indicates consistency, the processor CPU does not determine that the operational malfunction has occurred in the monitored circuit 400_1. However, when the comparison result indicates inconsistency, the processor CPU determines that the operational malfunction has occurred in the monitored circuit 400_1 to execute the recovery processing (at step S20).

In advance of the recovery processing for the monitored circuit 400_1, the processor CPU reads the recovery processing type corresponding to the monitored circuit 400_1 from the recovery processing database DB_2 shown in FIG. 10A (at step S21), thereby recognizing that the recovery processing type is either reset processing or reference data overwrite processing (at step S22).

Since the "reset processing" is set for the recovery processing type corresponding to the monitored circuit 400_1 in this example, a reset signal is transmitted to the reset input RST of the monitored circuit 400_1 to execute the reset processing for the monitored circuit 400_1 (at step S23).

The processor CPU reads the reference data D1_1-D1_3 corresponding to the monitored circuit 400_1 from the reference database DB_1 in the same way as the initial startup for restarting (at step S24), and writes the reference data D1_1-D3_2 in the reference data write destination addresses A1_1-A3_2 respectively of the corresponding monitored circuit 400_1 (at step S25).

Also, when recognizing that the recovery processing type is the reference data overwrite processing at the above-mentioned step S22, the processor CPU executes the overwrite processing of the reference data in the same way as the above-mentioned steps S24 and S25.

After the recovery processing for the monitored circuit 400_1 has been completed, the processor CPU determines whether or not the operational malfunction detection processing for all of the monitored circuits 400 has been completed (at step S26). Since the operational malfunction detection processing for the monitored circuits 400_2 and 400_3 has not been yet executed, the processor CPU sequentially repeats the above-mentioned steps S10-S25 for the monitored circuits 400_2 and 400_3 hereafter.

Embodiment [5]: FIGS. 1A, 1B, 3, 4, and 13

Figure 13:
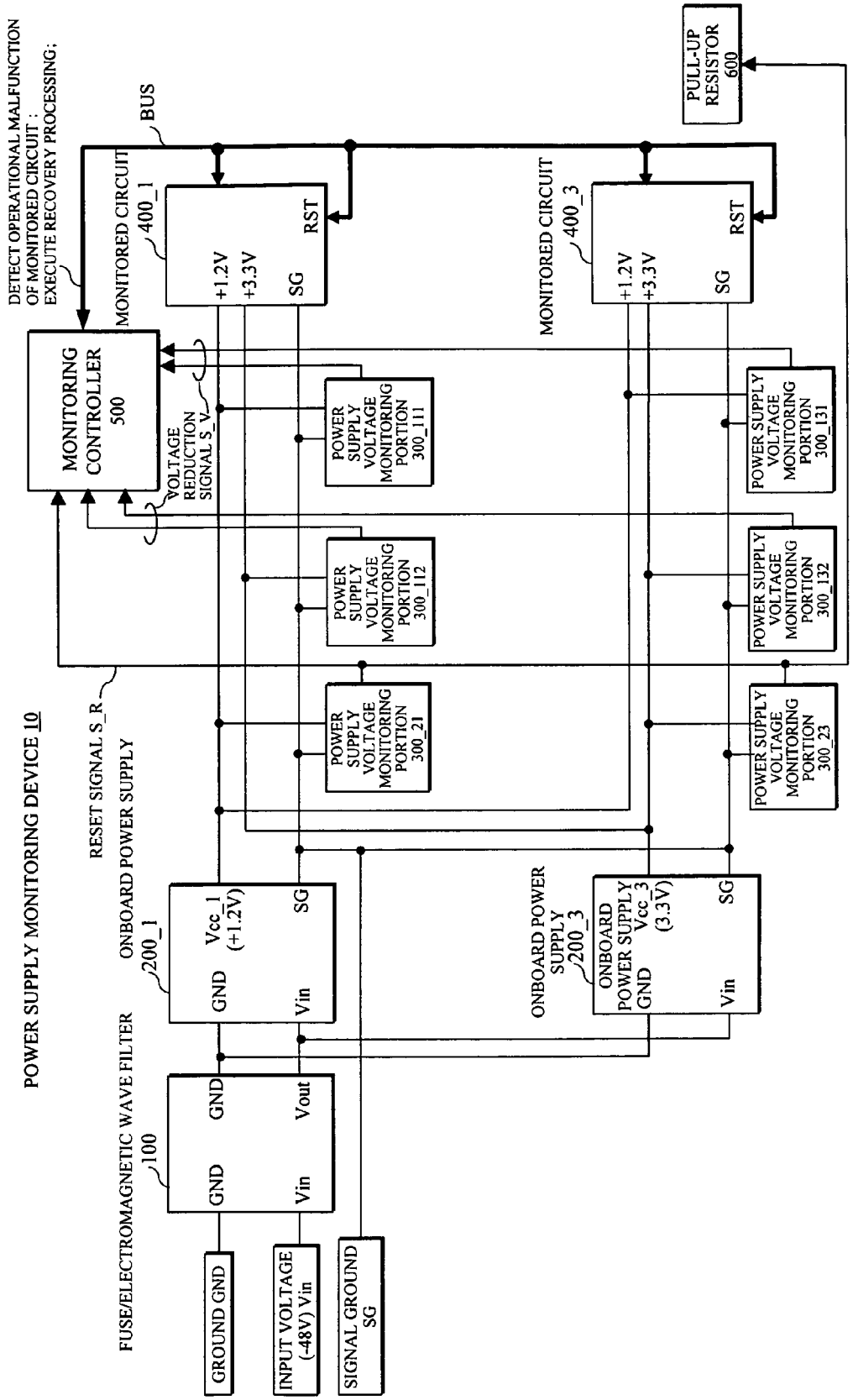
FIG. 13 is a block diagram showing an embodiment [5] of a power supply monitoring device according to the present invention.

The power supply monitoring device 10 shown in FIG. 13 is composed of the fuse/electromagnetic wave filter 100, the onboard power supplies 200_1 and 200_3 supplying the voltages Vcc_1 and Vcc_3 of e.g. "+1.2 V" and "+3.3 V" respectively, the monitored circuits 400_1 and 400_3 operated with the power supply voltages Vcc_1 and Vcc_3, power supply voltage monitoring portions 300_111 and 300_131 monitoring the voltage V2 in parallel for the monitored circuits 400_1 and 400_3 to which the voltage Vcc_1 is supplied in parallel, power supply voltage monitoring portions 300_112 and 300_132 monitoring the voltage V2 in parallel for the monitored circuits 400_1 and 400_3 to which the voltage Vcc_3 is supplied in parallel, the power supply voltage monitoring portions 300_21 and 300_23 respectively monitoring the voltage V3 for each of the power supply voltages Vcc_1 and Vcc_3, the monitoring controller 500 performing the operational malfunction detection of the monitored circuits 400_1 and 400_3 and recovery processing for the monitored circuits 400_1 and 400_3, and the pull-up resistor 600 commonly connected to the power supply voltage monitoring portions 300_21 and 300_23.

Also, the onboard power supplies 200_1 and 200_3, the power supply voltage monitoring portions 300_111, 300_131, 300_112, 300_132, 300_21, and 300_23, and the monitored circuits 400_1 and 400_3 are commonly connected to the signal ground SG. The monitoring controller 500, the monitored circuits 400_1 and 400_3, the reset inputs RST of the monitored circuits 400_1 and 400_3 are commonly connected with a bus BUS.

The power supply monitoring device 10 is arranged, in addition to the arrangement of the above-mentioned embodiment [4], so that the power supply voltage monitoring portions 300_112 and 300_131 respectively monitor the voltage Vcc_3 supplied to the monitored circuit 400_1 and the voltage Vcc_1 supplied to the monitored circuit 400_3. The operation of the monitoring controller 500 at the time when the voltage reduction signal S_V is received from the power supply voltage monitoring portions 300_112 and 300_131 is the same as that of the above-mentioned embodiment [4].

In the power supply monitoring device 10, like the above-mentioned embodiment [4], the power supply voltage monitoring portions 300_111 and 300_131 provide the voltage reduction signal S_V to the monitoring controller 500 when the power supply voltage Vcc_1 is reduced down to the voltage V2, and the power supply voltage monitoring portions 300_112 and 300_132 provide the voltage reduction signal S_V to the monitoring controller 500 when the power supply voltage Vcc_3 is reduced down to the voltage V2.

The monitoring controller 500 having received the voltage reduction signal S_V from any one of the power supply voltage monitoring portions 300_111, 300_112, 300_131, and 300_132 executes operational malfunction detection processing to the monitored circuits 400_1 and 400_3 in the same way as the above-mentioned embodiment [4].

Also, in the same way as the above-mentioned embodiment [4], the power supply voltage monitoring portion 300_21 provides the reset signal S_R to the monitoring controller 500 when the power supply voltage Vcc_1 is reduced down to the voltage V3, and the power supply voltage monitoring portion 300_23 provides the reset signal S_R to the monitoring controller 500 when the power supply voltage Vcc_3 is reduced down to the voltage V3.

The monitoring controller 500 having received the reset signal S_R from the power supply voltage monitoring portion 300_21 or 300_23 executes the reset processing for the controller 500 itself in the same way as the above-mentioned embodiment [4], and autonomously recovers from the operational malfunction.

Figure 5A:
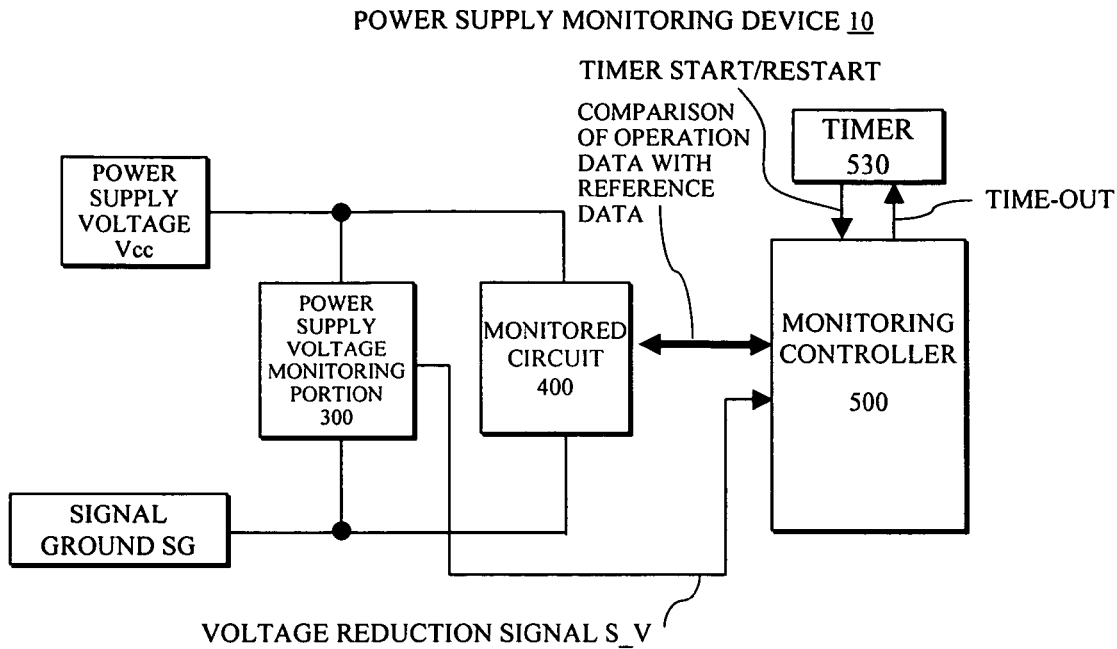
FIGS. 5A and 5B are block diagrams showing a principle [5] of a power supply monitoring device according to the present invention.
Figure 5B:
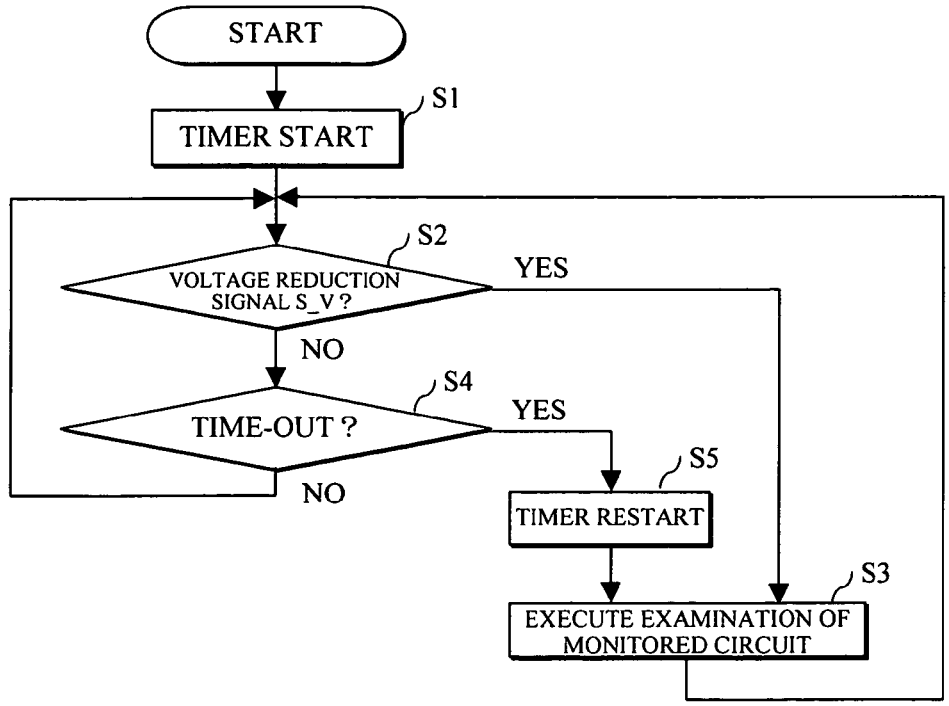

It is to be noted that the above-mentioned embodiments [1]-[5] can be provided with the timer portion 530 notifying a time-out to the monitoring controller 500 as shown in FIGS. 5A and 5B.

It is to be noted that the present invention is not limited by the above-mentioned embodiments, and it is obvious that various modifications may be made by one skilled in the art based on the recitation of the claims.

What is claimed is:
1. A power supply monitoring device comprising:
a power supply voltage monitoring portion monitoring a power supply voltage supplied to a monitored circuit and outputting a voltage reduction signal when detecting that the power supply voltage is reduced below a predetermined threshold; and a monitoring controller determining whether or not an operational malfunction has occurred in the monitored circuit by comparing operation data of the monitored circuit with reference data held by the monitoring controller itself upon receiving the voltage reduction signal.

2. The power supply monitoring device as claimed in claim 1, wherein the threshold comprises a second voltage higher than a first voltage guaranteeing a normal operation of the monitored circuit and lower than a rated voltage.

3. The power supply monitoring device as claimed in claim 1, wherein the monitoring controller includes means performing, when determining that the operational malfunction has occurred, reset processing according to a recovery processing type specific to the monitored circuit prestored for the monitored circuit or overwrite processing of the reference data for the operation data for controlling the monitored circuit.

4. The power supply monitoring device as claimed in claim 2, further comprising a second power supply voltage monitoring portion outputting a reset signal to the monitoring controller when detecting that the power supply voltage is reduced down to a third voltage lower than the first voltage, the monitoring controller including means performing reset processing to the monitoring controller itself upon receiving the reset signal.

5. The power supply monitoring device as claimed in claim 1, wherein a plurality of power supply voltage monitoring portions and power supply voltages are provided, in which each of the power supply voltage monitoring portions is provided for each of the power supply voltages, and the monitoring controller determines whether or not an operational malfunction has occurred in the monitored circuit upon receiving the voltage reduction signal from any one of the power supply voltage monitoring portions.

6. The power supply monitoring device as claimed in claim 1, wherein a plurality of power supply voltage monitoring portions are provided, each of which is provided so as to monitor each of monitored circuits in parallel, and the monitoring controller determines whether or not an operational malfunction has occurred for each of the monitored circuits respectively upon receiving the voltage reduction signal from any one of the power supply voltage monitoring portions.

7. The power supply monitoring device as claimed in claim 1, further comprising a timer portion instructing the monitoring controller to periodically determine whether or not an operational malfunction has occurred in the monitored circuit.

8. The power supply monitoring device as claimed in claim 1, wherein the monitoring controller includes means writing the reference data prestored for controlling the monitored circuit in a register of the monitored circuit upon initial startup, and means reading the reference data from the register as the operation data upon receiving the voltage reduction signal from the power supply voltage monitoring portion, and comparing the operation data read with the reference data stored to determine that the operational malfunction has occurred when both are inconsistent.

9. The power supply monitoring device as claimed in claim 1, wherein the monitoring controller includes means calculating a checksum or a CRC of the reference data to be stored inside the monitoring controller every time the monitoring controller writes the reference data prestored for controlling the monitored circuit in a register of the monitored circuit upon initial startup, and means reading the reference data from the register as the operation data upon receiving the voltage reduction signal from the power supply voltage monitoring portion, and comparing a check sum or a CRC calculated from the operation data read with the check sum or the CRC stored to determine that the operational malfunction has occurred when both are inconsistent.

10. The power supply monitoring device as claimed in claim 1, wherein the monitoring controller includes means calculating a parity bit from the reference data prestored for controlling the monitored circuit upon initial startup, and writing the calculated parity bit and the reference data in the register of the monitored circuit, and means reading from the register the parity bit and the reference data as the operation data upon receiving the voltage reduction signal from the power supply voltage monitoring portion, and determining that the operational malfunction has occurred when checking the operation data read by using the parity bit read to detect a parity error.

* * * * *